(12) United States Patent
Schultz

(10) Patent No.: US 10,186,510 B2
(45) Date of Patent: Jan. 22, 2019

(54) VERTICAL GATE ALL AROUND LIBRARY ARCHITECTURE

(71) Applicant: Advanced Micro Devices, Inc., Sunnyvale, CA (US)

(72) Inventor: Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/632,877

(22) Filed: Jun. 26, 2017

(65) Prior Publication Data
US 2018/0315751 A1 Nov. 1, 2018

Related U.S. Application Data

(60) Provisional application No. 62/492,698, filed on May 1, 2017.

(51) Int. Cl.
*H01L 27/088* (2006.01)
*H01L 29/78* (2006.01)
(Continued)

(52) U.S. Cl.
CPC ........ *H01L 27/088* (2013.01); *G06F 17/5072* (2013.01); *H01L 29/0676* (2013.01); *H01L 29/42356* (2013.01); *H01L 29/7827* (2013.01)

(58) Field of Classification Search
CPC ............. H01L 29/0665; H01L 29/0669; H01L 29/0676; H01L 29/0692; H01L 29/0696; H01L 21/823418; H01L 21/823431; H01L 21/823437; H01L 21/823475; H01L 21/823487; Y10S 977/70; Y10S 977/902;
(Continued)

(56) References Cited

U.S. PATENT DOCUMENTS 6,156,600 A 12/2000 Chao et al.
7,723,806 B2 * 5/2010 Liaw .................... H01L 27/1104
257/207
(Continued)

FOREIGN PATENT DOCUMENTS

WO 2014/051769 A1 4/2014
WO WO-2015199644 A1 * 12/2015 ..... H01L 21/823487

OTHER PUBLICATIONS

Schultz et al., U.S. Appl. No. 15/275,028, entitled "Power Grid Layout Designs for Integrated Circuits", filed Sep. 23, 2016, 36 pages.
(Continued)

*Primary Examiner* — Sonya D. McCall-Shepard
(74) *Attorney, Agent, or Firm* — Meyertons Hood Kivlin Kowert and Goetzel PC; Rory D. Rankin

(57) ABSTRACT

A system and method for creating a layout for a vertical gate all around standard cell are described. Metal gate is placed all around two vertical nanowire sheets formed on a silicon substrate. A gate contact is formed on the metal gate between the two vertical nanowire sheets. Gate extension metal (GEM) is placed above the metal gate at least on the gate contact. A via for a gate is formed at a location on the GEM where a local interconnect layer is available to be used for routing a gate connection. Local metal layers are placed for connecting local routes and power connections.

17 Claims, 15 Drawing Sheets

(51) Int. Cl.
 *H01L 29/06* (2006.01)
 *H01L 29/423* (2006.01)
 *G06F 17/50* (2006.01)

(58) Field of Classification Search
 CPC . Y10S 977/932; Y10S 977/936; Y10S 977/93
 See application file for complete search history.

(56) References Cited

U.S. PATENT DOCUMENTS

| | | | |
|---|---|---|---|
| 8,063,450 B2* | 11/2011 | Wernersson | B82Y 10/00 257/213 |
| 8,561,003 B2* | 10/2013 | Kawa | H01L 27/0207 438/129 |
| 9,425,318 B1 | 8/2016 | Hoentschel et al. | |
| 9,704,995 B1 | 7/2017 | Schultz | |
| 2001/0041402 A1 | 11/2001 | Yamamoto | |
| 2006/0216897 A1 | 9/2006 | Lee et al. | |
| 2007/0157144 A1 | 7/2007 | Mai et al. | |
| 2007/0278528 A1 | 12/2007 | Ato et al. | |
| 2009/0187871 A1 | 7/2009 | Cork | |
| 2010/0148219 A1 | 6/2010 | Shimizu | |
| 2011/0151668 A1 | 6/2011 | Tang et al. | |
| 2012/0007051 A1 | 1/2012 | Bangsaruntip et al. | |
| 2012/0138886 A1 | 6/2012 | Kuhn et al. | |
| 2013/0155753 A1 | 6/2013 | Moon et al. | |
| 2013/0161792 A1 | 6/2013 | Tran et al. | |
| 2014/0106474 A1 | 4/2014 | Chen et al. | |
| 2014/0145342 A1 | 5/2014 | Schultz et al. | |
| 2014/0183643 A1 | 7/2014 | Colinge et al. | |
| 2014/0374879 A1 | 12/2014 | Chen et al. | |
| 2015/0061087 A1 | 3/2015 | Hong | |
| 2015/0144880 A1 | 5/2015 | Rachmady et al. | |
| 2015/0243519 A1 | 8/2015 | Devilliers | |
| 2015/0295036 A1 | 10/2015 | Hong | |
| 2015/0370951 A1* | 12/2015 | Kawa | G06F 17/5072 716/119 |
| 2015/0372104 A1 | 12/2015 | Liu et al. | |

OTHER PUBLICATIONS

Schultz, Richard T., U.S. Appl. No. 15/421,157, entitled "Gate All Around Device Architecture With Hybrid Wafer Bond Technique", filed Jan. 31, 2017, 38 pages.

International Search Report and Written Opinion in International Application No. PCT/US2017/052339, dated Dec. 6, 2017, 15 pages.

Dargis et al., "Epitaxial Growth and Properties of Silicon on Crystalline Rare-Earth-Metal Oxide for SOI-Applications" Materials Science, May 1, 2009, pp. 11-15, vol. 15, No. 1.

Schultz, Richard T., U.S. Appl. No. 15/466,643, entitled "Oscillating Capacitor Architecture in Polysilicon for Improved Capacitance", filed Mar. 22, 2017, 34 pages.

Schultz, Richard T., U.S. Appl. No. 15/819,879, entitled "Metal Zero Power Ground Stub Route to Reduce Cell Area and Improve Cell Placement at the Chip Level", filed Nov. 21, 2017, 28 pages.

Schultz, Richard T., U.S. Appl. No. 15/608,749, entitled "Double Spacer Immersion Lithography Triple Patterning Flow and Method", filed May 30, 2017, 53 pages.

* cited by examiner

US 10,186,510 B2

VERTICAL GATE ALL AROUND LIBRARY ARCHITECTURE

CROSS REFERENCE TO RELATED APPLICATIONS

This application claims priority to Provisional Patent Application Ser. No. 62/492,698, entitled "Vertical Gate All Around Library Architecture", filed May 1, 2017, the entirety of which is incorporated herein by reference.

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, leakage currents and processing yield are some issues which affect the placement of devices and the routing of signals across an entire die of a semiconductor chip. Additionally, as the transistor dimensions decrease, the short channel effects increase. Other examples of short channel effects other than leakage current are latchup effects, drain-induced barrier lowering (DIBL), punchthrough, performance dependency on temperature, impact ionization, and parasitic capacitance to the silicon substrate and to the wells used for the source and drain regions. Thus, these issues have the potential to delay completion of the design and affect the time to market.

In order to shorten the design cycle for semiconductor chips, manual full-custom designs are replaced with automation where possible. A designer provides a description of a functional unit or a complex gate in a high-level description language such as Verilog, VHDL and so on. A synthesis tool receives the logic description and provides the logical netlist. The logical netlist is used by a place-and-route (PNR) tool to provide physical layout. The place-and-route tool uses a cell layout library to provide the physical layout.

The cell layout library includes multiple standard cell layouts for providing the various functionalities used by the semiconductor chip. In some cases, a standard cell layout is created manually. Therefore, each new standard cell layout or each original standard cell layout being modified is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, height and width cell dimensions matching other cells, pin access, power rail design and so on. Therefore, designers manually create these cells to achieve better results for the multiple characteristics or rewrite the rules for the place-and-route tool.

The above process attempting to automate layout with a place-and-route tool becomes more complicated when non-planar devices (transistors) are used. Non-planar transistors are a recent development in semiconductor processing for reducing short channel effects. Tri-gate transistors, Fin field effect transistors (FETs) and gate all around (GAA) transistors are examples of non-planar transistors. The layout tools and rules are setup for planer devices, rather than for the relatively recent non-planar devices.

In view of the above, efficient methods and systems for creating layout for a vertical gate all around standard cell are desired.

BRIEF DESCRIPTION OF THE DRAWINGS

The advantages of the methods and mechanisms described herein may be better understood by referring to the following description in conjunction with the accompanying drawings, in which.

Figure 1:
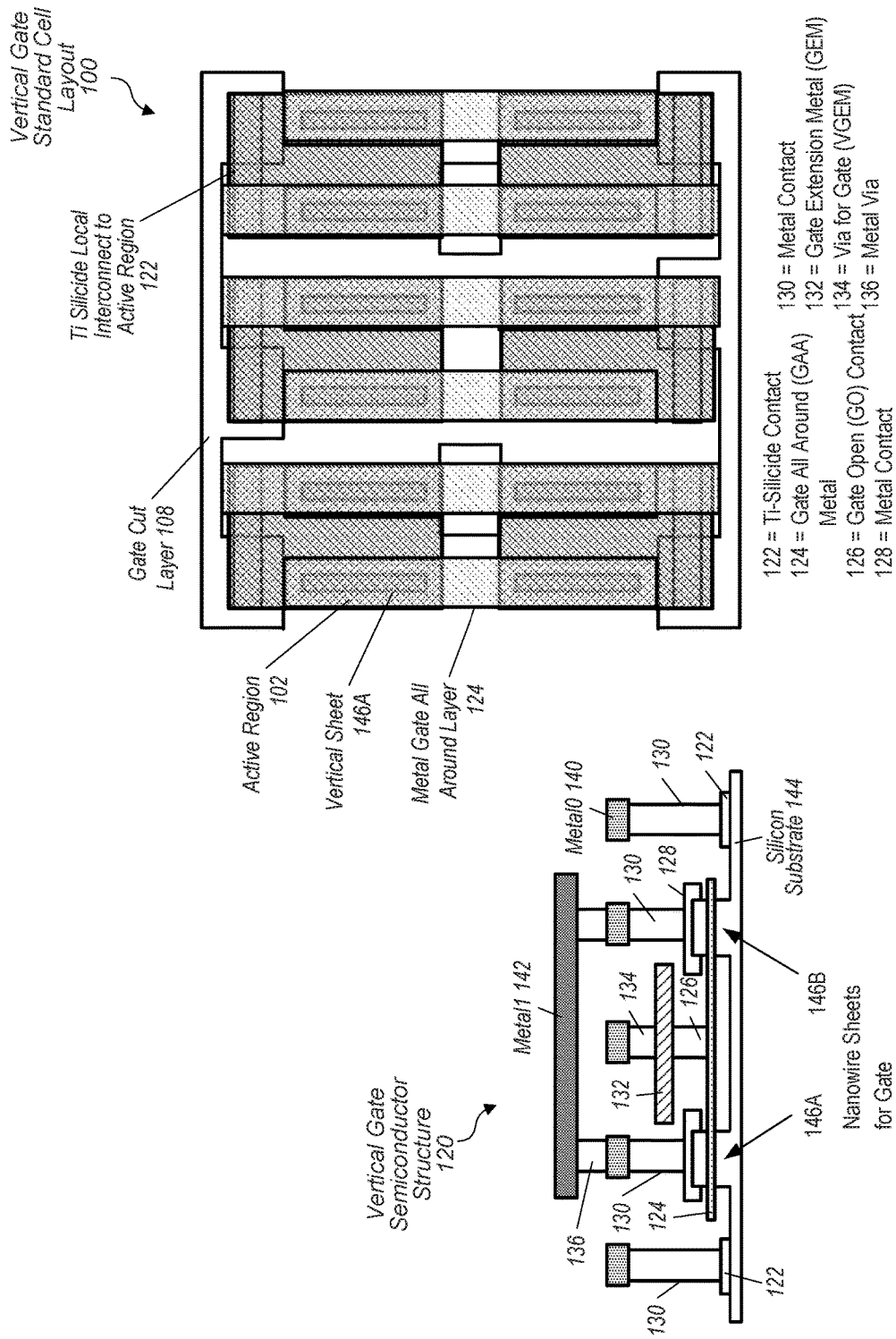
FIG. 1 is a generalized diagram of a top view of layout for a vertical gate all around standard cell being fabricated.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems and methods for creating layout for a vertical gate all around standard cell are contemplated. In various embodiments, a semiconductor device fabrication process for creating a vertical gate all around (GAA) standard cell layout forms multiple vertical nanowire sheets on a silicon substrate. The process places metal gate all around the vertical nanowire sheets and forms a gate contact on the metal gate, which is between two vertical nanowire sheets. A first vertical nanowire sheet of the two vertical nanowire sheets is used to create a p-channel device and a second vertical nanowire sheet is used to create an n-channel device.

The process places gate extension metal (GEM) above the metal gate on the gate contact without connecting to the metal gate. The GEM allows connections between the local interconnect layer and the metal gate to occur along a length of a corresponding device. In addition, the process forms a via for a gate (VGEM) at a location on the GEM where a local interconnect layer is available to be used for routing a gate connection. Afterward, the process forms two metal contacts on the two vertical nanowire sheets to create source and drain regions. Each of the GEM and VGEM does not connect to the two metal contacts. Local metal layers are placed for connecting local routes and power connections.

In the following description, the vertical gate all around standard cell layout architecture shown in FIGS. 1-13 provide standard cells for vertical gate all around (GAA) devices where the standard cells use power stubs or posts rather than power rails running across the standard cells. The layout architecture for standard cells using vertical GAA devices is different than for standard cells using horizontal GAA devices or Trigate devices. The FIGS. 1-13 illustrate the layout of a multiplexer complex gate using vertical GAA devices. However, the layout techniques shown in FIGS. 1-13 can be used for a variety of other standard cells used for other complex gates and functional units.

Turning now to FIG. 1, a generalized block diagram of a top view of a standard cell layout 100 is shown. A cross section of a vertical gate semiconductor structure 120 accompanies the layout 100. The standard cell layout 100 for the multiplexer uses six p-type metal oxide semiconductor (MOS) field effect transistors (FETS), or p-channel non-planar devices, at the top of the layout. In addition, the standard cell layout 100 for the multiplexer uses six n-type MOSFETS, or n-channel non-planar devices, at the bottom of the layout. The active region 102 is highlighted for the top left p-type device. The vertical nanowire sheet 146A comes up out of the page in a three-dimensional manner. The vertical nanowire sheet 146A is contained in the region within the inner rectangle within the active region 102. The gate all around (GAA) metal 124 wraps around the vertical nanowire 146A in the gate region in a 360 degree manner. The layer 108 is used to cut the gate layer and shows where the metal gates start and stop. The titanium silicide (ti-silicide) contact 122 is used to provide a local interconnection to the active region such as for the source and drain regions. In some embodiments, the ti-silicide contact 122 uses titanium disilicide (TiSi2).

Starting from the left, the second and fifth columns in the layout 100 do not have metal gate running continually from the p-type MOSFET (pfet) to the n-type MOSFET (nfet), so these devices are disconnected at the gate terminal. In contrast, the first, third, fourth and sixth columns have metal gate running continually from the pfet to the nfet, so these devices are connected at the gate terminal. For example, the connected devices can be used in an inverter circuit. In some embodiments, the self-aligned doubled patterning (SADP) technique is used to form the metal gates.

The semiconductor structure 120 shows a cross-sectional view of a fabrication technique for vertical GAA devices and accompanies the layout 100. Current for the vertical GAA device flows from the silicon substrate 144 at the bottom upward through the vertical nanowire sheets 146A-146B in the gate region through the metal contacts 128, through the metal contacts 130, through the metal zero layer (M0 or Metal0) 140 through the metal via 136 and through the metal one layer (M1 or Metal1) 142. In the illustrated embodiment, the metal contacts 130 skip the gate extension metal (GEM) 132. The metal contacts 130 are copper, tungsten or cobalt and the material used is based on the design tradeoff between resistance and process dependability.

The ti-silicide (TiSi2) contacts 122 are used for the source and drain regions. The metal gate 124 wraps around the vertical nanowire sheets 146A-146B in the gate region in a 360 degree manner and does not go through the vertical nanowire sheets 146A-146B and does not sit on top of the vertical nanowire sheets 146A-146B. The gate contact 126 connects the metal gate 124 to the gate extension metal (GEM) 132. In the illustrated embodiment, the GEM 132 is only used above the gate contact 126.

Figure 2:
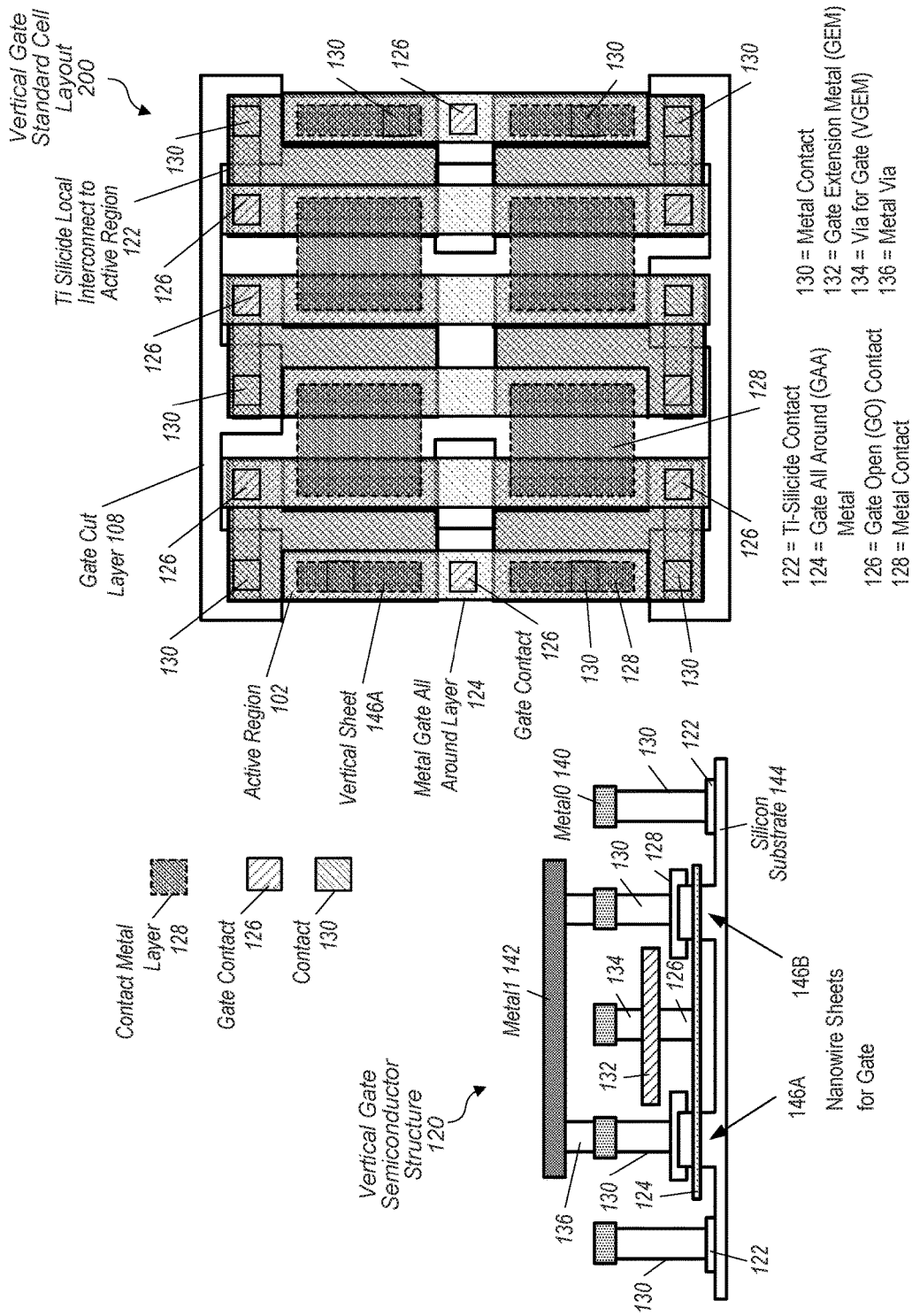
FIG. 2 is a generalized diagram of another top view of layout for a vertical gate all around standard cell being fabricated.

Turning now to FIG. 2, a generalized block diagram of a top view of a standard cell layout 200 is shown. A cross section of a vertical gate semiconductor structure 120 accompanies the layout 200. Contacts, materials and structures described earlier are numbered identically. The metal contacts 128 are formed to create contacts which connect to the vertical nanowire sheets 146A-146B above the metal gate 124 but are not connected to the metal gate 124. The metal contact 128 is formed horizontally from one device to another to connect sources or drains in the circuit. Although not shown, in some embodiments, the metal contact 128 is formed vertically when the gate contact 126 is not present in order to connect the source and drain regions of a p-channel device to the source and drain regions of an n-channel device. If the bottom of a given device is the drain region, then the top of the given device is the source region, and vice-versa.

The gate open (GO) contacts 126 are formed next in the standard cell layout 200. Each device has a single gate connection which uses the gate contact 126. The gate contact 126 can be shared as it is for the first column from the left in addition to the third, fourth and sixth columns. As described earlier, these pfets and nfets have connected gate terminals.

The second and fifth columns have disconnected gates, and accordingly, each of the pfets and nfets has a respective gate contact 126. The separate gate contacts 126 are seen at the top of the cell and the bottom of the cell for the second and fifth columns. As described earlier, the gate cut layer 108 is shown to disconnect the metal gates for the second and fifth columns.

It is noted for horizontal devices (transistors), the gate contact 126 is able to be placed in several locations such as over active regions, in between devices (pfets and nfets), at the top of the cell, in the middle of the cell, and at the bottom of the cell. This flexible placement exists for horizontal GAA devices too. However, this flexible placement does not exist for vertical GAA devices. Looking at the layout 200, it can be seen if the gate contact 126 moves much, it will make electrical shorts (connections) with the vertical nanowire sheets 146A-146B, and then, the gate terminal is shorted with either the source terminal or the drain terminal. Therefore, for vertical GAA devices, the gate contacts 126 are placed in only one of three locations.

The three locations for the gate contacts 126 include the top of the cell layout 200, the middle of the cell layout 200, and the bottom of the cell layout 200. Each of these three locations is located away from the vertical sheets, such as the vertical sheets 146A, shown in the cell layout 200. Afterward, the contacts 130 are formed in the cell layout 300. As shown, the contacts 130 terminate on the ti-silicide (TS) contacts 122 or the metal contacts 128. The contacts 130 are used for the source and drain regions.

Figure 3:
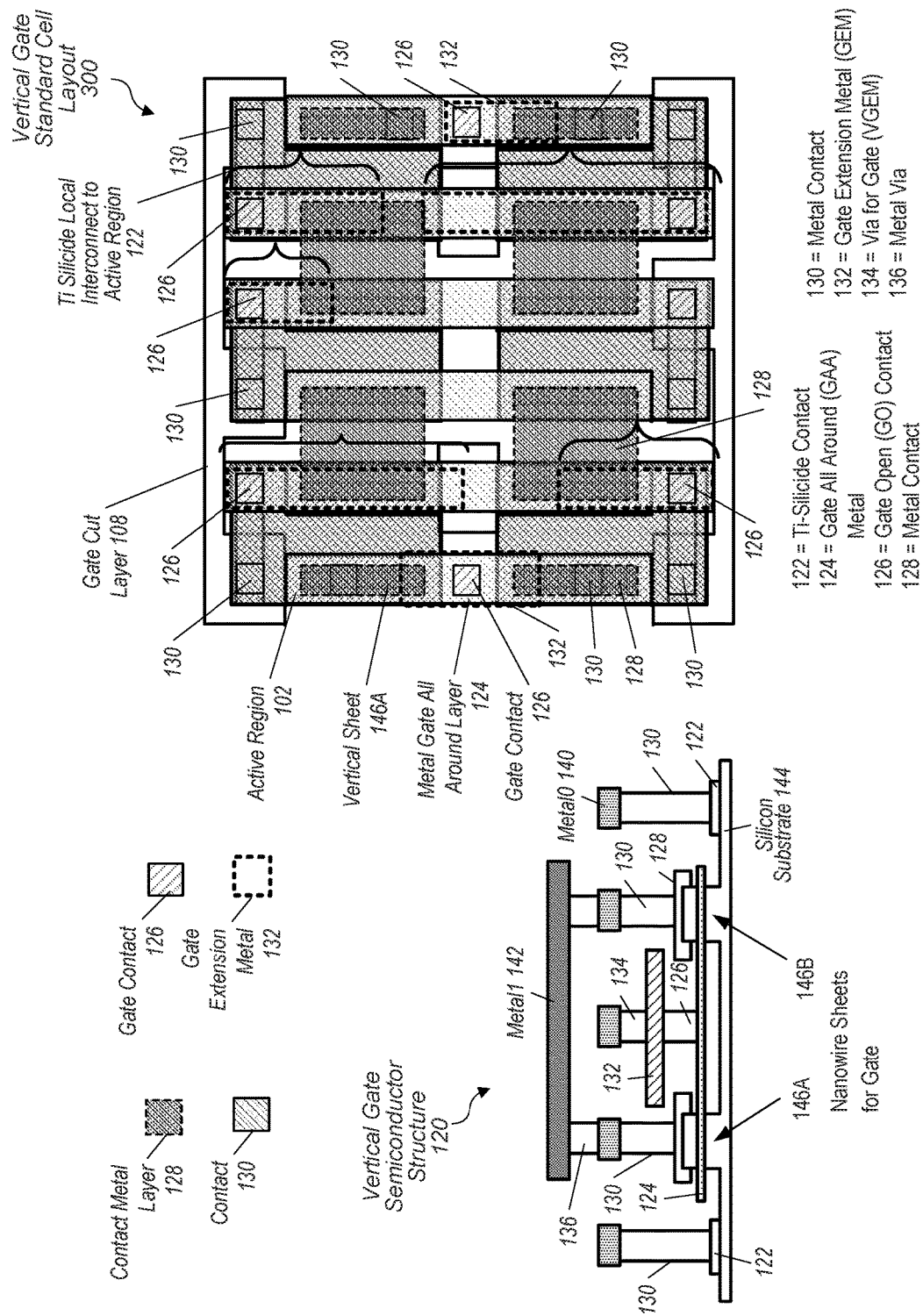
FIG. 3 is a generalized diagram of another top view of layout for a vertical gate all around standard cell being fabricated.

Referring to FIG. 3, a generalized block diagram of a top view of a standard cell layout 300 is shown. A cross section of a vertical gate semiconductor structure 120 accompanies the layout 300. Contacts, materials and structures described earlier are numbered identically. Here, the gate extension metal (GEM) 132 is formed. The curly braces in addition to the dashed boxes indicate the locations of the GEM 132 in the cell layout 300. As shown in the structure 120, each of the GEMs 132 is also placed on top of the gate open (GO) contacts 126 in the cell layout 300. As shown, in various embodiments, a GEM 132 is not centered on the GO contact 126. The GEM 132, though, is aligned over the metal gate 124 and a GO contact 126. This placement allows the gate 124 to be connected to upper level metal layers.

Without the GEM 132, connections to the gate terminal, such as through the GO contacts 126, can only occur at the top, middle or bottom of the cell 300. There would only be three horizontal tracks available for routing the gate terminals of the pfets and nfets. With the GEM 132, connections to the gate terminal are able to occur in more locations in the cell layout 300, thus, offering better routing flexibility. The GEM 132 allows the connection to the gate to occur vertically higher than the GO contact 126 and reach the horizontal metal zero (M0) 140 or the vertical metal one (M1) 142. The GEM 132 allows connections between the local interconnect layer, such as metal0 layer 140 which is placed later, and the metal gate 124 through the gate contact 126 to occur along a length of a corresponding device.

Figure 4:
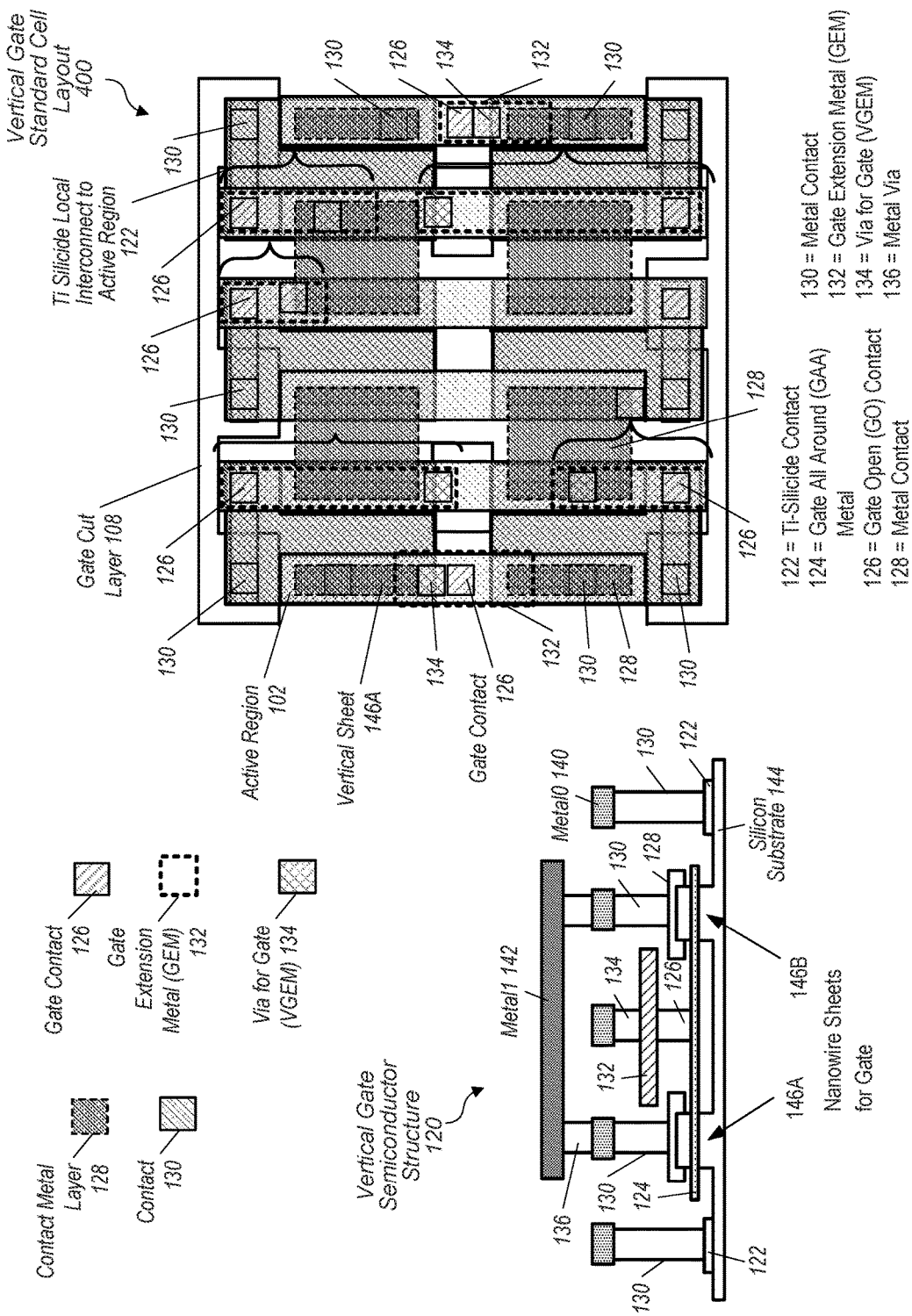
FIG. 4 is a generalized diagram of another top view of layout for a vertical gate all around standard cell being fabricated.

Referring to FIG. 4, a generalized block diagram of a top view of a standard cell layout 400 is shown. A cross section of a vertical gate semiconductor structure 120 accompanies the layout 400. Contacts, materials and structures described earlier are numbered identically. The vias for gates (VGEMs) 134 used to connect the GEM 132 to the horizontal M0 140 are placed in the cell layout 400. Again, the curly braces indicate the locations of the GEM 132. The vias for gates (VGEMs) 134 do not connect to the metal contact 128 or the metal gate 124. The vias for gates (VGEMs) 134 are placed where the GEM 132 and the later Metal0 140 intersect.

Figure 5:
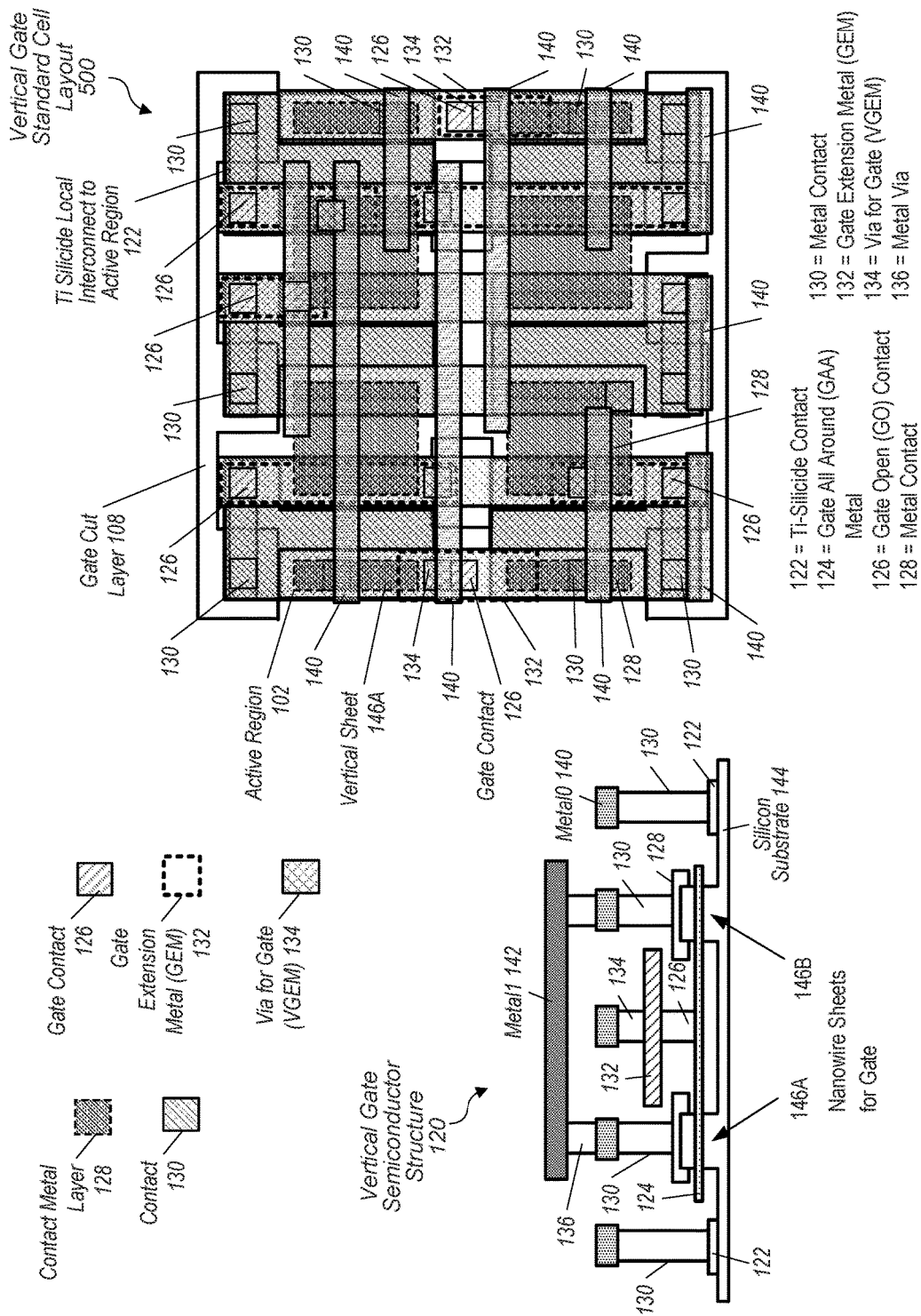
FIG. 5 is a generalized diagram of another top view of layout for a vertical gate all around standard cell being fabricated.
Figure 6:
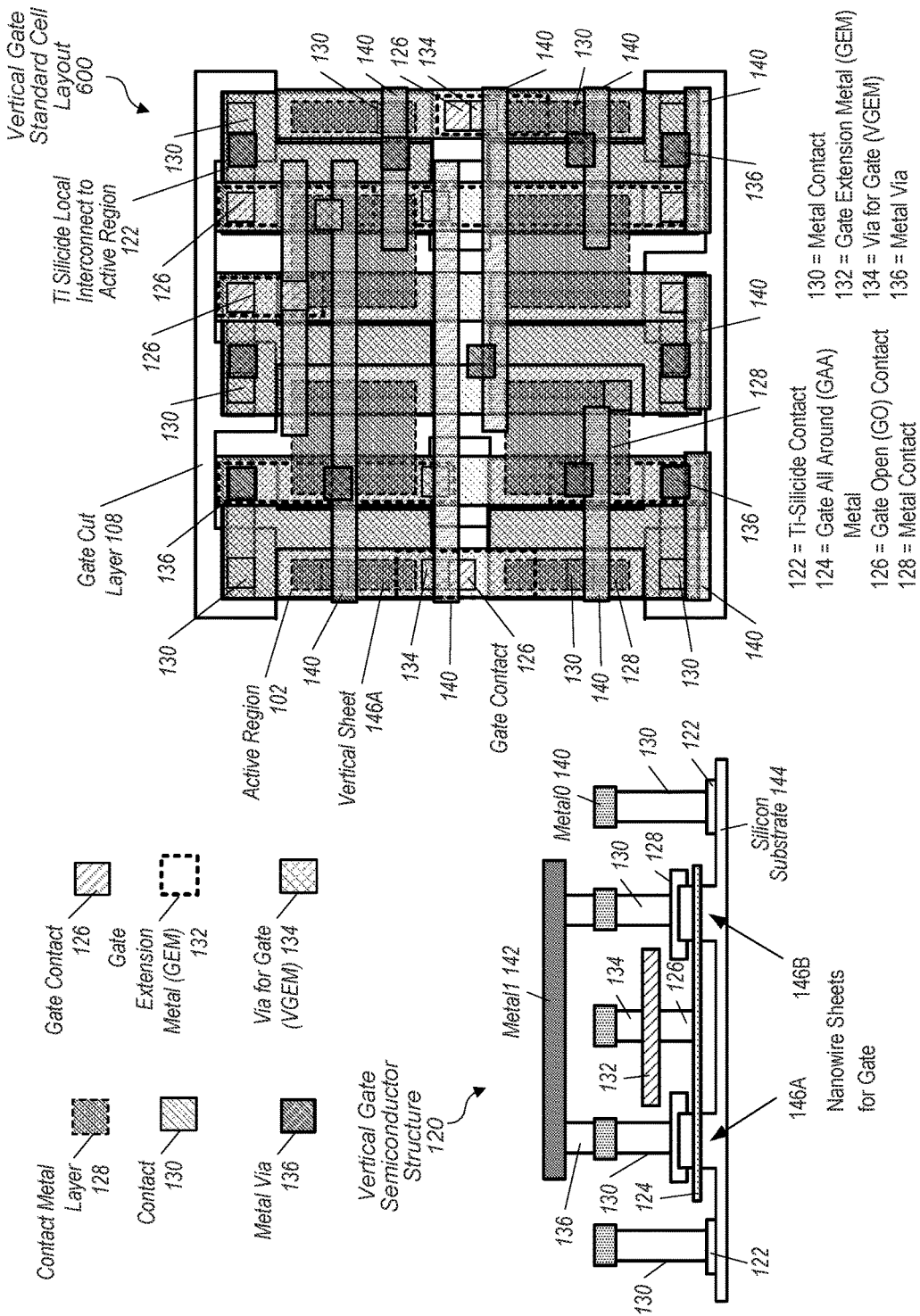
FIG. 6 is a generalized diagram of another top view of layout for a vertical gate all around standard cell being fabricated.
Figure 7:
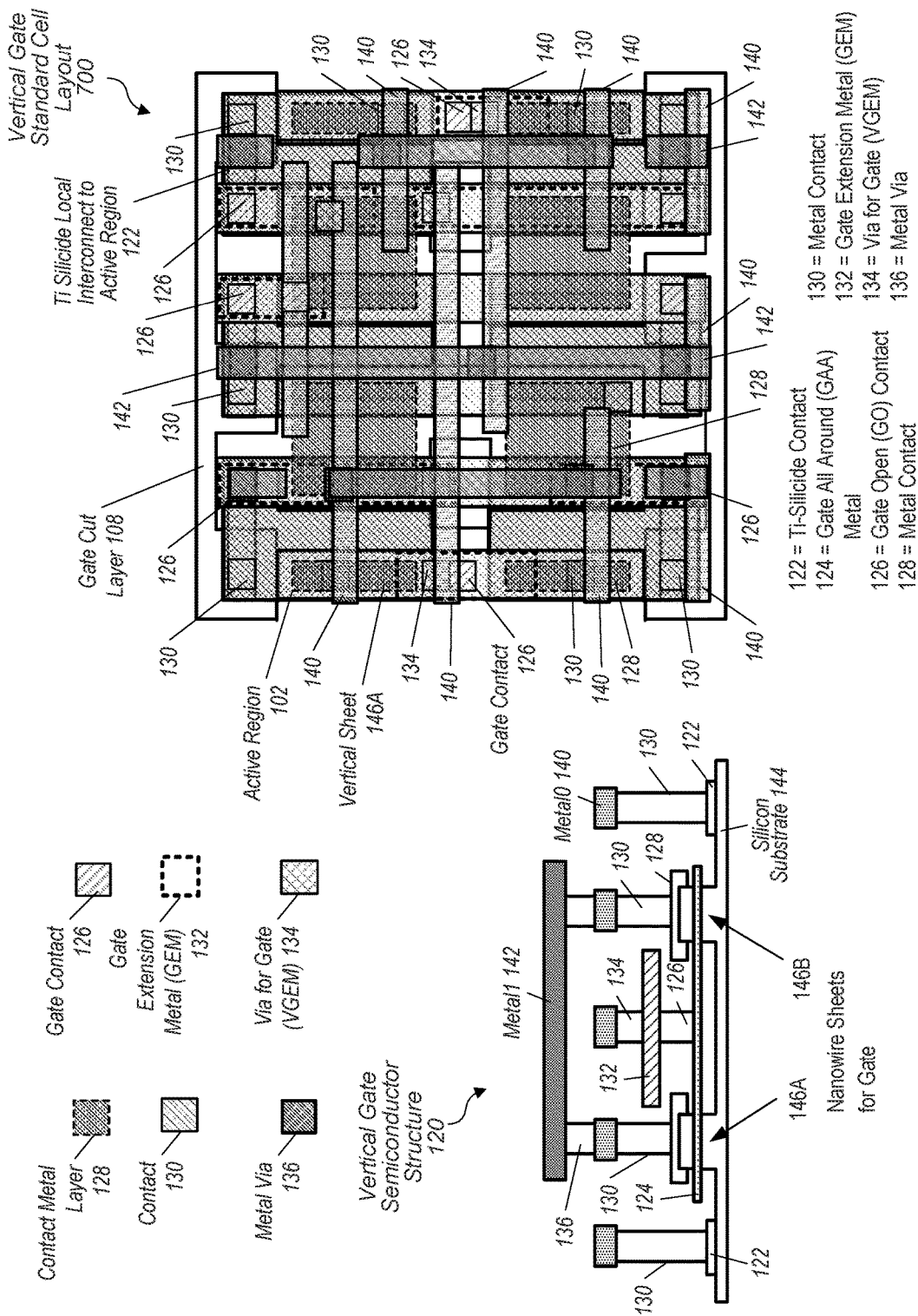
FIG. 7 is a generalized diagram of another top view of layout for a vertical gate all around standard cell being fabricated.

Referring to FIGS. 5-7, generalized block diagrams of top views of standard cell layout 500, 600 and 700 are shown. A cross section of a vertical gate semiconductor structure 120 accompanies the layouts 500, 600 and 700. Contacts, materials and structures described earlier are numbered identically. In FIG. 5, the horizontal metal zero (Metal 0, M0) connections 140 are placed in the cell layout 500. Routes are now available horizontally and vertically in the cell. It is noted the vias for gates (VGEMs) 134 are placed where the GEM layers 132 and the Metal0 layers 140 intersect.

Next, connections from the horizontal Metal0 140 to the vertical Metal1 142 are to be done, so the metal vias 136 are placed as shown in FIG. 6. Following, the vertical Metal1 layers 142 are placed as shown in FIG. 7. The input and output pins have the option of being connected in Metal0 140 or Metal1 142. The power (VDD) pin connection is shown at the top of the cell layout 700 and the ground (VSS, GND) connection is made at the bottom of the cell layout 700. It is also noted no routing (the GEM layer 132, the horizontal Metal0 140 and the vertical Metal1 142) use bends or L-shapes in the signal routes. Metal layers with no bends or L-shapes are referred to as unidirectional layers. Metal layers with bends or L-shapes are referred to as bidirectional layers, and bidirectional layers block tracks for routing, and accordingly, reduce routing flexibility.

Figure 8:
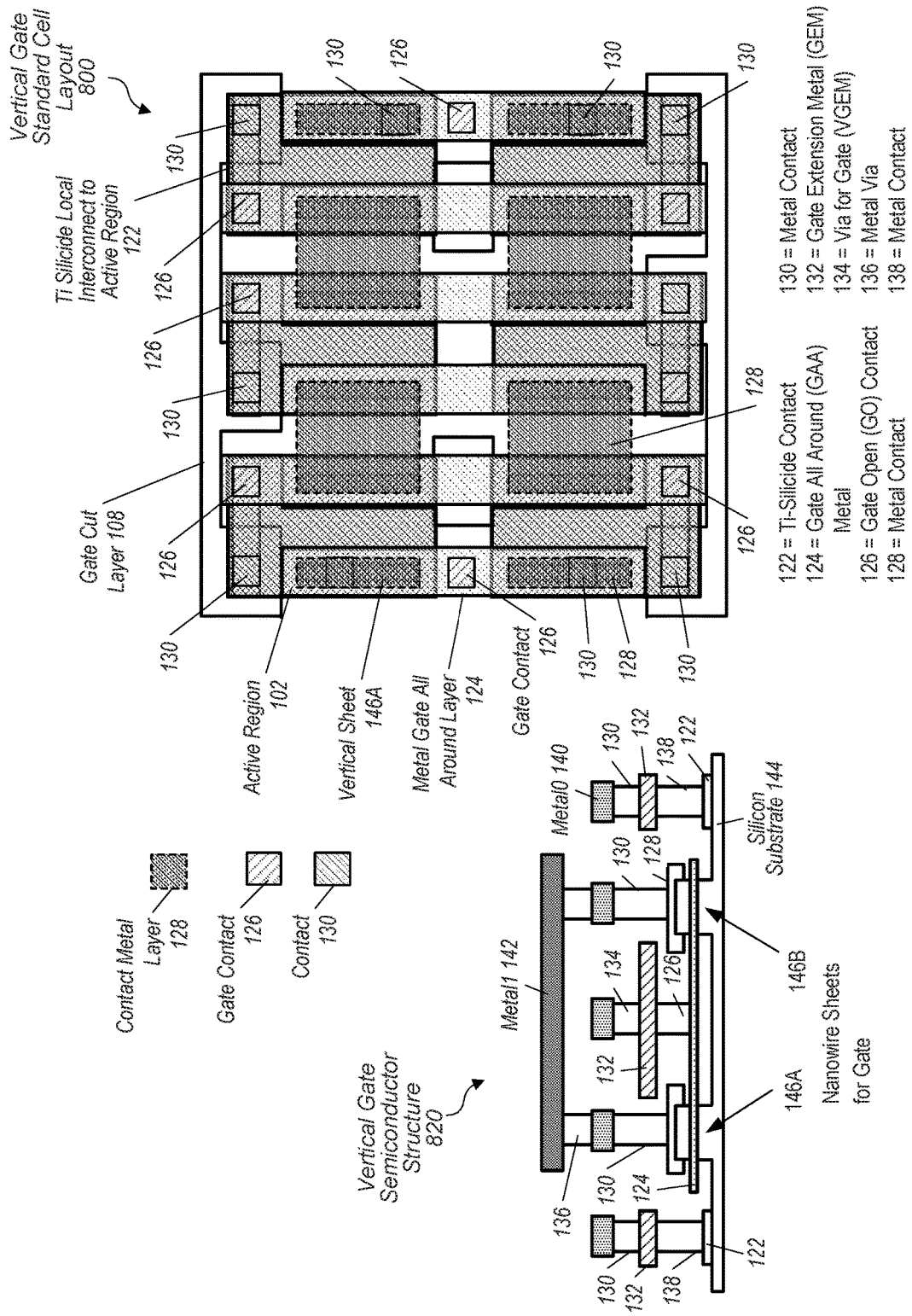
FIG. 8 is a generalized diagram of another top view of layout for a vertical gate all around standard cell being fabricated.

The above description for FIGS. 1-7 describes the steps for creating a vertical gate all around (GAA) standard cell layout using gate extension metal (GEM) 132 only on the gate contact 126. However, in other embodiments, the GEM 132 is additionally placed on the metal contacts 130 above the ti-silicide contacts 122 in the source and drain regions. FIGS. 8-13 illustrate these alternative steps. Referring to FIG. 8, a generalized block diagram of a top view of a standard cell layout 800 is shown. A cross section of a vertical gate semiconductor structure 820 accompanies the layout 800. Contacts, materials and structures described earlier are numbered identically. As shown, the semiconductor structure 820 uses the gate extension metal (GEM) 132 at the source and drain regions too. The cell layout 800 on the right has each processing step prior to the forming the GEMs 132 layer already performed.

In the illustrated embodiment, the GEM 132 is used in the gate region above the gate contact 126 as described earlier and now additionally used in each of the source and drain regions above the ti-silicide contacts 122. As shown, each of the metal contacts 130 immediately to the left and right of the middle GEM 132 are contacts that skip the use of the GEM 132. The metal contacts 130 and 138 use are copper, tungsten or cobalt and the material used is based on the design tradeoff between resistance and process dependability.

Figure 9:
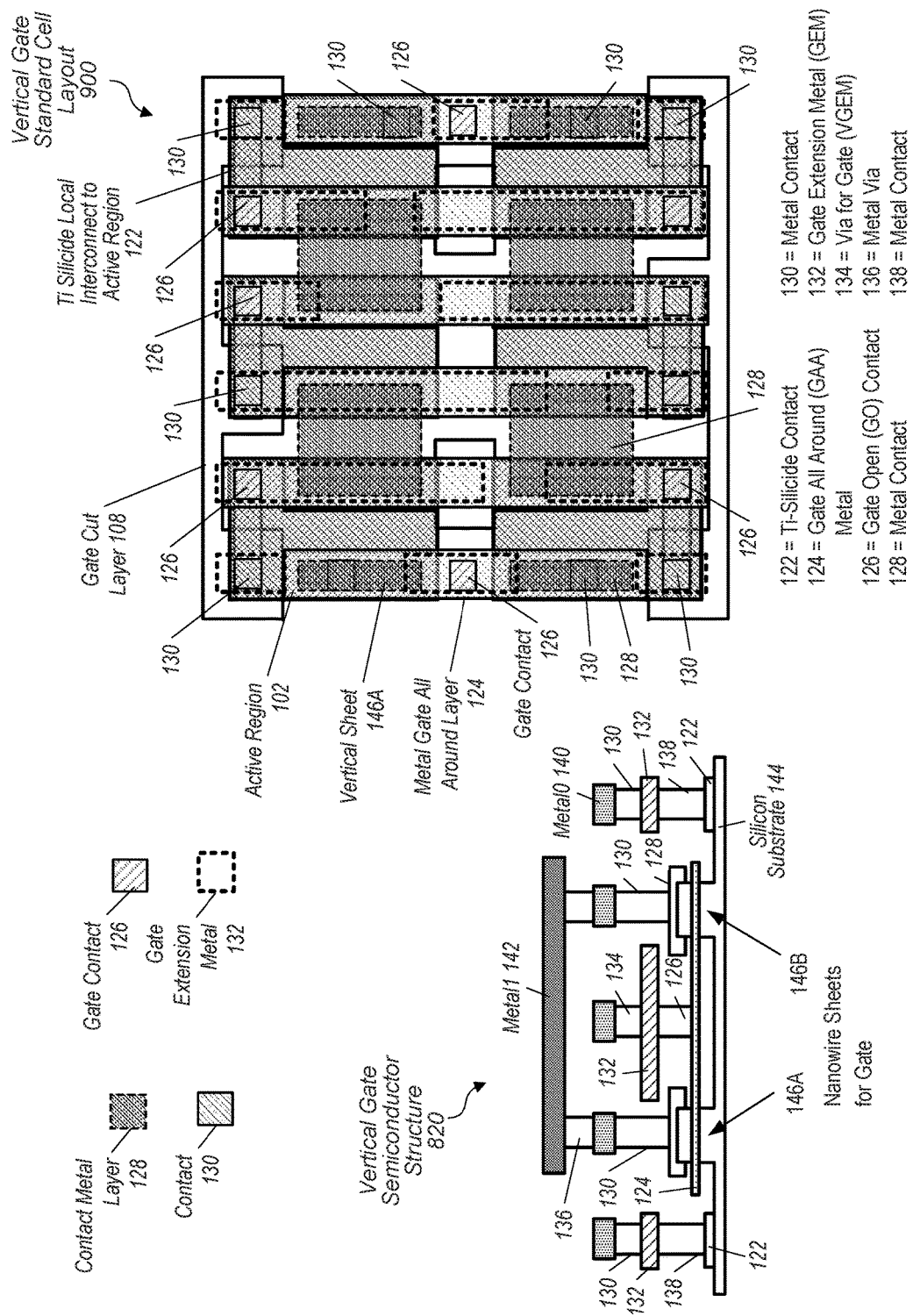
FIG. 9 is a generalized diagram of another top view of layout for a vertical gate all around standard cell being fabricated.

Referring to FIG. 9, a generalized block diagram of a top view of a standard cell layout 900 is shown. A cross section of a vertical gate semiconductor structure 820 accompanies the layout 900. Contacts, materials and structures described earlier are numbered identically. In the embodiment shown, the GEMs 132 are formed. The dashed lines indicate the locations of the GEMs 132 in the cell layout 900. Comparing FIG. 9 to the earlier FIG. 3, it can be seen there are more GEMs 132 in the cell layout 900 when the GEM 132 is used in the source and drain regions. The GEM 132 allows connections between the local interconnect layer, such as metal0 layer 140 which is placed later, and the metal gate 124 through the gate contact 126 to occur along a length of a corresponding device.

Figure 10:
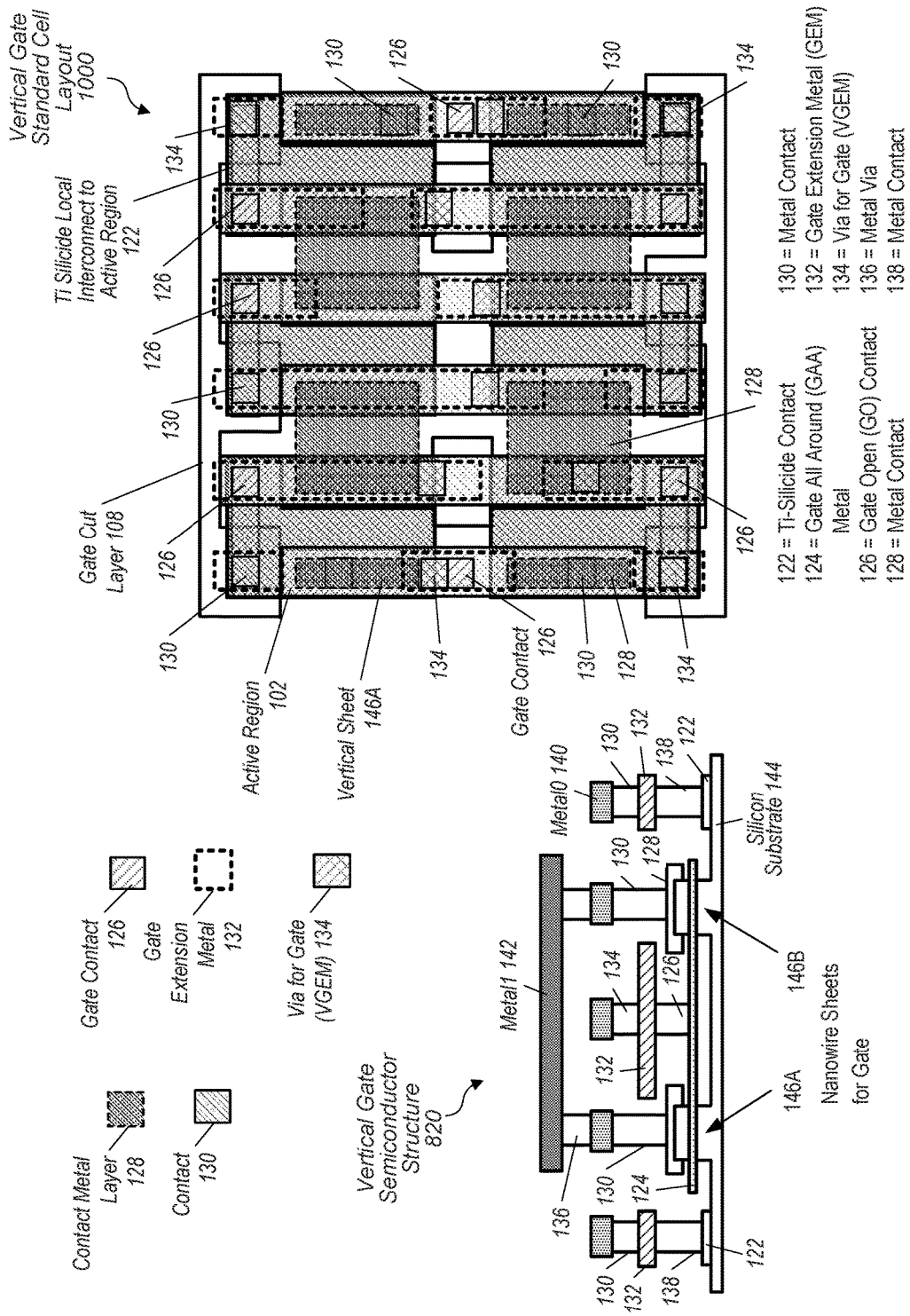
FIG. 10 is a generalized diagram of another top view of layout for a vertical gate all around standard cell being fabricated.

Referring to FIG. 10, a generalized block diagram of a top view of a standard cell layout 1000 is shown. A cross section of a vertical gate semiconductor structure 820 accompanies the layout 1000. Contacts, materials and structures described earlier are numbered identically. The vias for gates (VGEMs) 134 used to connect the GEM 132 to the horizontal M0 140 are placed in the cell layout 1000. Again, the dashed lines indicate the locations of the GEM 132. The vias for gates (VGEMs) 134 do not connect to the metal contact 128 or the metal gate 124. The vias for gates (VGEMs) 134 are placed where the GEM 132 and the later Metal0 140 intersect.

Figure 11:
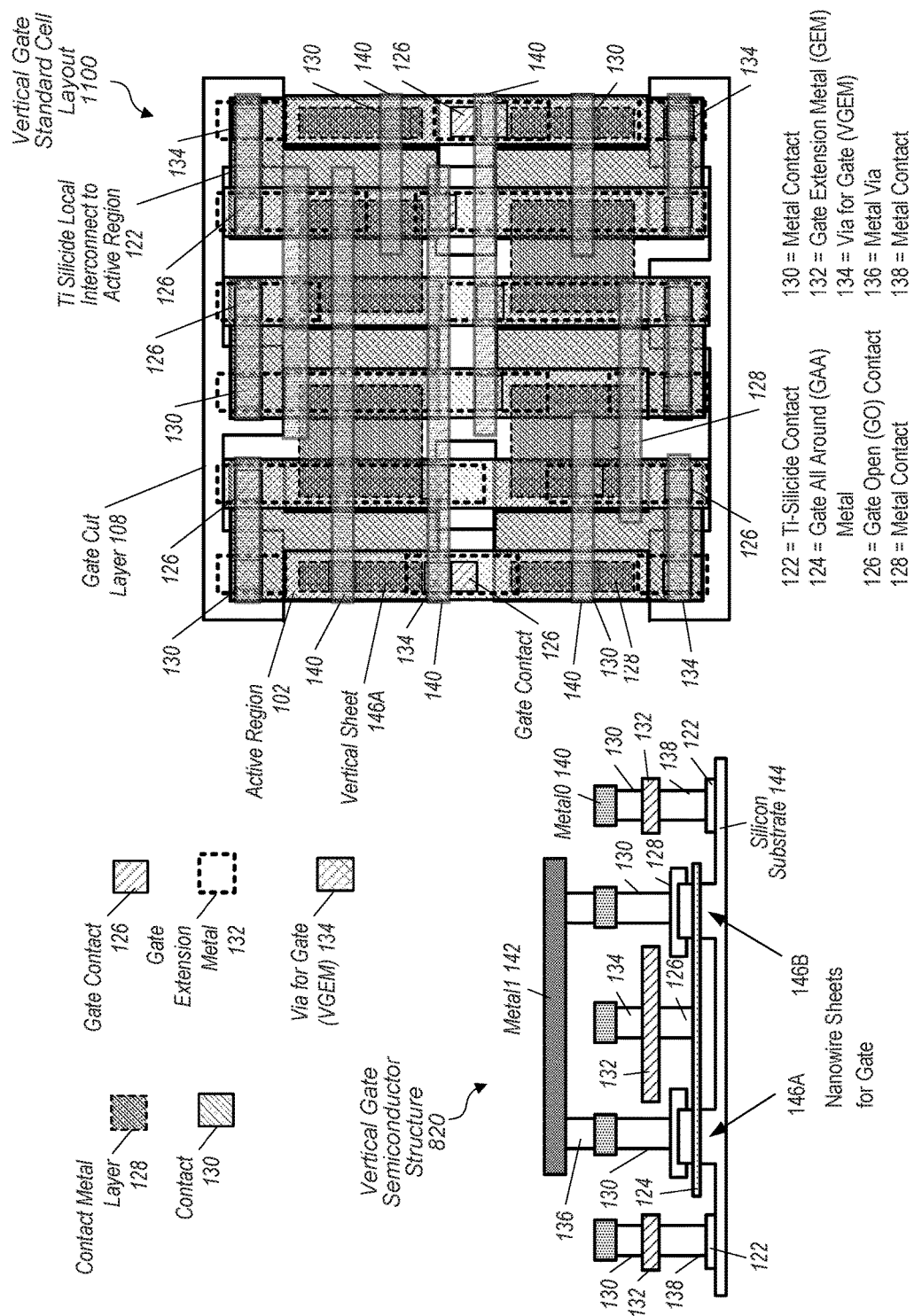
FIG. 11 is a generalized diagram of another top view of layout for a vertical gate all around standard cell being fabricated.
Figure 12:
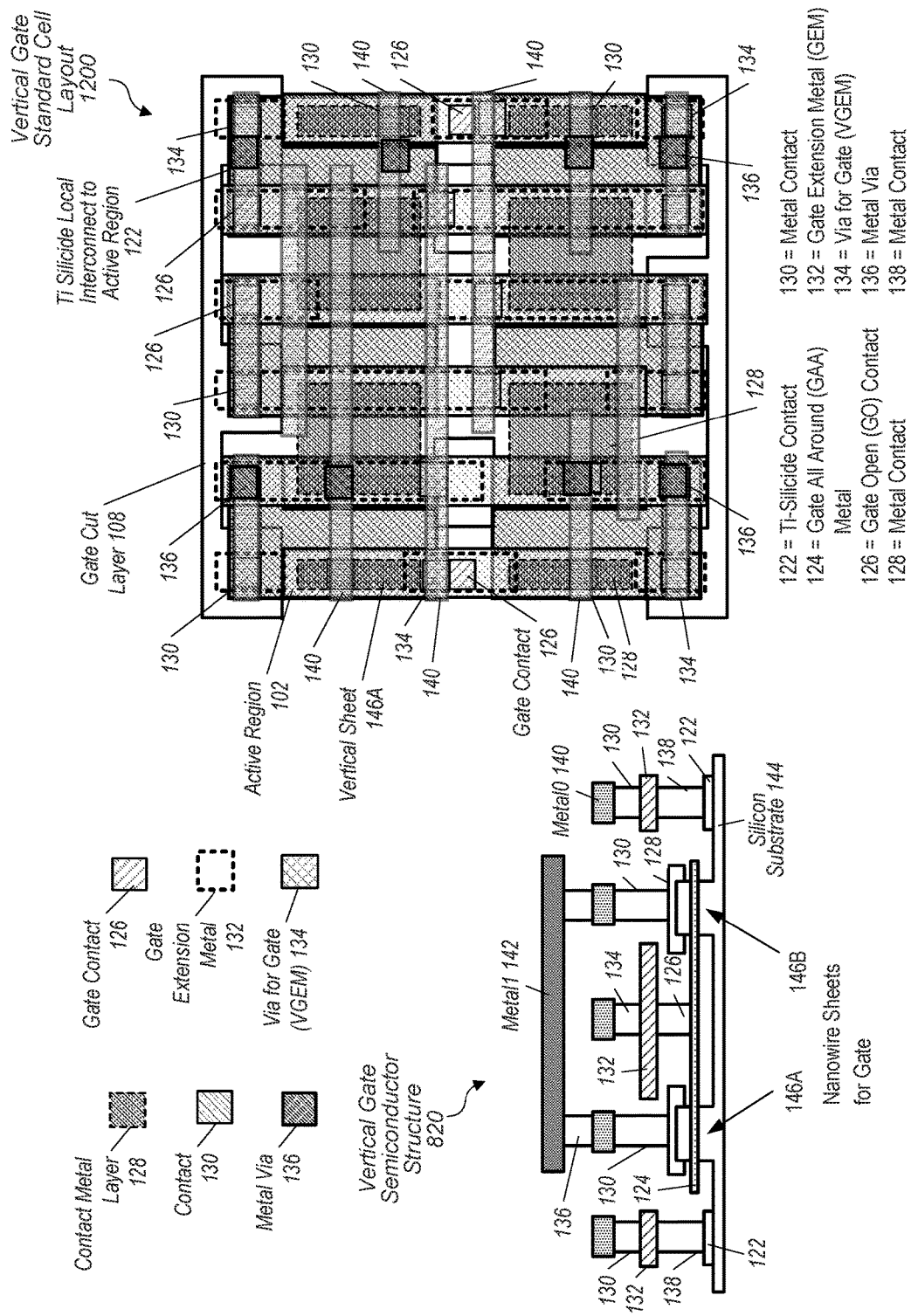
FIG. 12 is a generalized diagram of another top view of layout for a vertical gate all around standard cell being fabricated.
Figure 13:
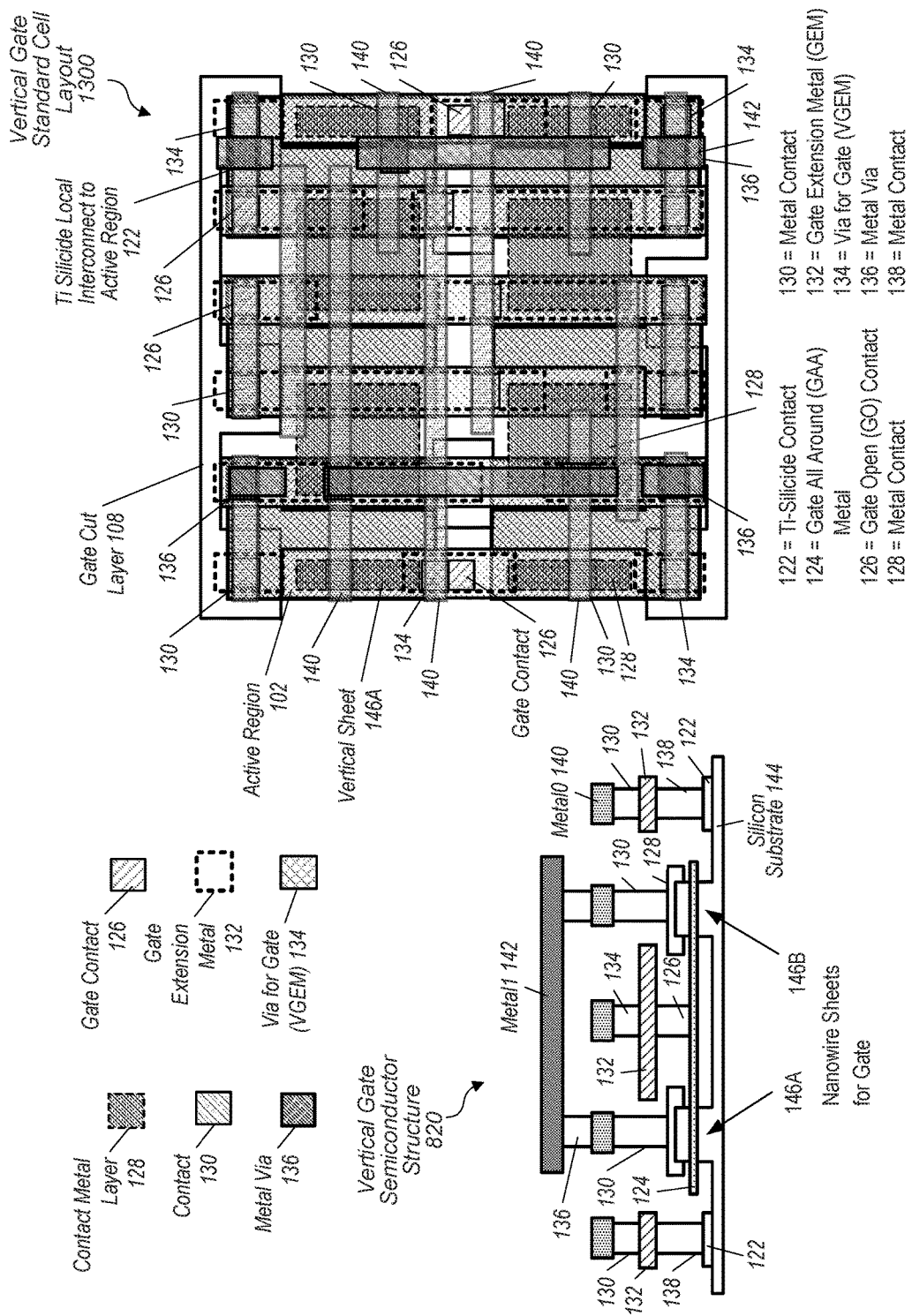
FIG. 13 is a generalized diagram of another top view of layout for a vertical gate all around standard cell being fabricated.

Referring to FIGS. 11-13, generalized block diagrams of top views of standard cell layout 1100, 1200 and 1300 are shown. A cross section of a vertical gate semiconductor structure 820 accompanies the layouts 1100, 1200 and 1300. Contacts, materials and structures described earlier are numbered identically. In FIG. 11, the horizontal metal zero (Metal 0, M0) connections 140 are placed in the cell layout 1100. Routes are now available horizontally and vertically in the cell. It is noted the vias for gates (VGEMs) 134 are placed where the GEM layers 132 and the Metal0 layers 140 intersect. It is also noted the horizontal metal 0 140 routes are unidirectional routes.

Next, connections from the horizontal Metal0 140 to the vertical Metal1 142 are to be done, so the metal vias 136 are placed as shown in FIG. 12. Following, the vertical Metal1 layers 142 are placed as shown in FIG. 13. The input and output pins have the option of being connected in Metal0 140 or Metal1 142. The power (VDD) pin connection is shown at the top of the cell layout 1300 and the ground (VSS, GND) connection is made at the bottom of the cell layout 1300. It is also noted no routing (the GEM layer 132, the horizontal Metal0 140 and the vertical Metal1 142) use unidirectional routes.

Figure 14:
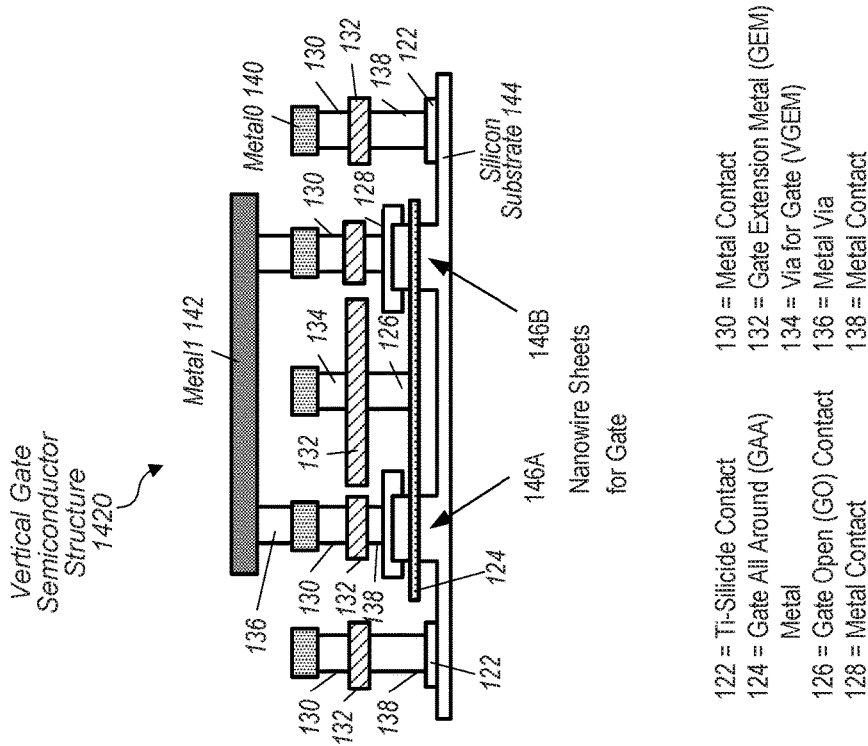
FIG. 14 is a generalized diagram of a cross section view of a semiconductor structure for a vertical gate all around device to be fabricated.

The above description for FIGS. 8-13 describes the steps for creating a vertical gate all around (GAA) standard cell layout using gate extension metal (GEM) 132 on the gate contact 126 and on the metal contacts 130 above the ti-silicide contacts 122, and additionally on the metal contacts 130 above the vertical nanowire sheets 146A-146B. However, in other embodiments, the GEM 132 is additionally placed on the metal contacts 130 above the vertical nanowire sheets 146A-146B. Referring to FIG. 14, a generalized block diagram of a cross section view of a vertical gate semiconductor structure 1420 is shown. Contacts, materials and structures described earlier are numbered identically. In various embodiments, processing steps for creating a vertical standard cell layout for the structure 1420 use similar steps described earlier for the structures 120 and 820.

Figure 15:
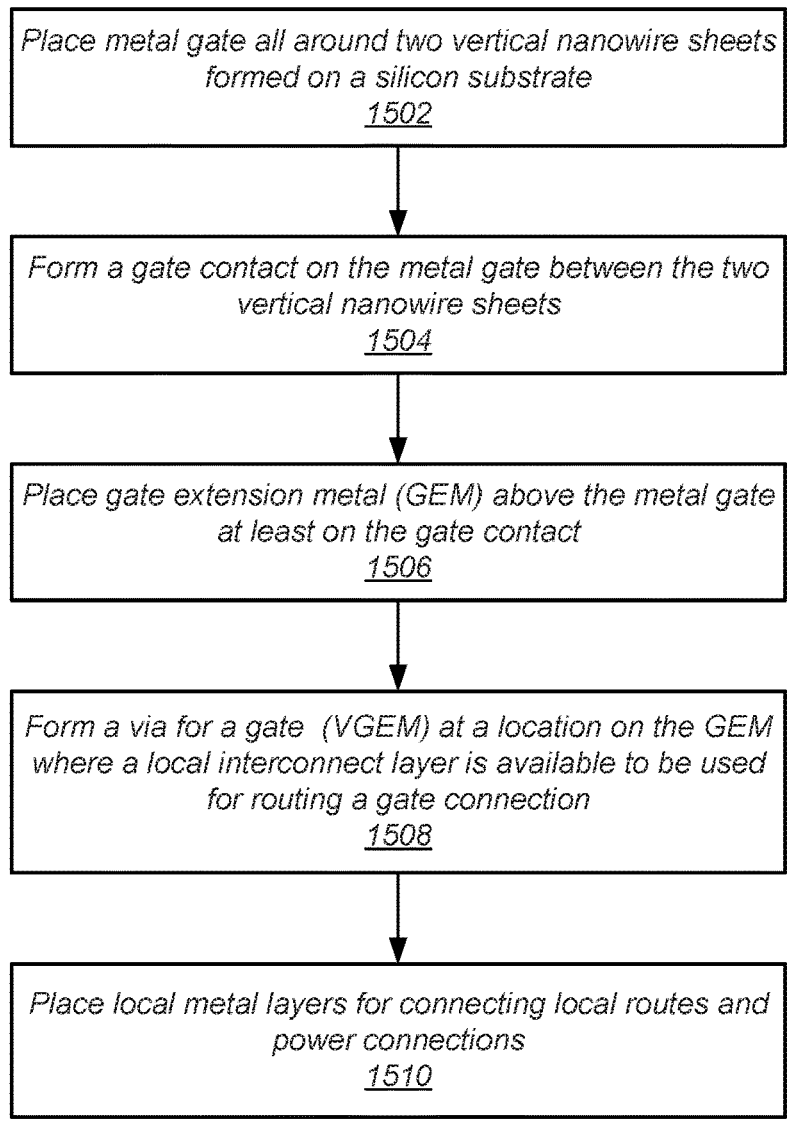
FIG. 15 is a generalized diagram of a method for creating layout for a vertical gate all around standard cell.

Referring now to FIG. 15, one embodiment of a method 1500 for creating layout for a vertical gate all around (GAA) standard cell is shown. For purposes of discussion, the steps in this embodiment are shown in sequential order. However, in other embodiments some steps occur in a different order than shown, some steps are performed concurrently, some steps are combined with other steps, and some steps are absent.

Metal gate is placed all around two vertical nanowire sheets formed on a silicon substrate (block 1502). A gate contact is formed on the metal gate between the two vertical nanowire sheets (block 1504). Gate extension metal (GEM) is placed above the metal gate at least on the gate contact (block 1506). A via for a gate (VGEM) is formed at a location on the GEM where a local interconnect layer is available to be used for routing a gate connection (block 1508). Local metal layers are placed for connecting local routes and power connections (block 1510).

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process for creating a standard cell layout comprising:
   forming a plurality of vertical nanowire sheets on a silicon substrate;
   placing metal gate around the plurality of vertical nanowire sheets;
   forming a gate contact on the metal gate between two vertical nanowire sheets of the plurality of vertical nanowire sheets;
   placing gate extension metal (GEM) above the metal gate on the gate contact;
   forming a via for a gate (VGEM) at a location on the GEM where a local interconnect layer is available to be used for routing a gate connection; and
   forming two metal contacts on the two vertical nanowire sheets to create source and drain regions, wherein each of the GEM and VGEM do not connect to the two metal contacts.

2. The semiconductor device fabrication process as recited in claim 1, wherein the GEM allows connections between the local interconnect layer and the metal gate to occur along a length of a corresponding device.

3. The semiconductor device fabrication process as recited in claim 1, wherein a first vertical nanowire sheet of the two vertical nanowire sheets is used to create a p-channel device and a second vertical nanowire sheet of the two vertical nanowire sheets is used to create an n-channel device.

4. The semiconductor device fabrication process as recited in claim 1, wherein the local interconnect layer used for routing the gate connection is a local metal zero layer.

5. The semiconductor device fabrication process as recited in claim 1, wherein each of the source and drain regions uses at least a titanium silicide contact to connect a local interconnect comprising a metal zero layer.

6. The semiconductor device fabrication process as recited in claim 5, wherein the process further comprises placing gate extension metal (GEM) on metal contacts above one or more of the titanium silicide contacts and the two vertical nanowire sheets.

7. The semiconductor device fabrication process as recited in claim 1, wherein the process further comprises placing local metal layers for connecting local routes and power connections within the standard cell.

8. A standard cell layout comprising:
   a plurality of vertical nanowire sheets on a silicon substrate;
   metal gate placed around the plurality of vertical nanowire sheets;
   a gate contact formed on the metal gate between two vertical nanowire sheets of the plurality of vertical nanowire sheets;
   gate extension metal (GEM) placed above the metal gate on the gate contact;
   a via for a gate (VGEM) formed at a location on the GEM where a local interconnect layer is available to be used for routing a gate connection; and
   two metal contacts formed on the two vertical nanowire sheets to create source and drain regions, wherein each of the GEM and VGEM do not connect to the two metal contacts.

9. The standard cell layout as recited in claim 8, wherein the GEM allows connections between the local interconnect layer and the metal gate to occur along a length of a corresponding device.

10. The standard cell layout as recited in claim 8, wherein a first vertical nanowire sheet of the two vertical nanowire sheets is used to create a p-channel device and a second vertical nanowire sheet of the two vertical nanowire sheets is used to create an n-channel device.

11. The standard cell layout as recited in claim 8, wherein the local interconnect layer used for routing the gate connection is a local metal zero layer.

12. The standard cell layout as recited in claim 8, wherein each of the source and drain regions uses at least a titanium silicide contact to connect a local interconnect comprising a metal zero layer.

13. A non-transitory computer readable storage medium storing program instructions, wherein the program instructions for performing a semiconductor fabrication process are executable by a processor to:
   form a plurality of vertical nanowire sheets on a silicon substrate;
   place metal gate around the plurality of vertical nanowire sheets;
   form a gate contact on the metal gate between two vertical nanowire sheets of the plurality of vertical nanowire sheets;
   place gate extension metal (GEM) above the metal gate on the gate contact;
   form a via for a gate (VGEM) at a location on the GEM where a local interconnect layer is available to be used for routing a gate connection, and form two metal contacts on the two vertical nanowire sheets to create source and drain regions, wherein each of the GEM and VGEM do not connect to the two metal contacts.

14. The non-transitory computer readable storage medium as recited in claim 13, wherein the GEM allows connections between the local interconnect layer and the metal gate to occur along a length of a corresponding device.

15. The non-transitory computer readable storage medium as recited in claim 13, wherein a first vertical nanowire sheet of the two vertical nanowire sheets is used to create a p-channel device and a second vertical nanowire sheet of the two vertical nanowire sheets is used to create an n-channel device.

16. The non-transitory computer readable storage medium as recited in claim 13, wherein each of the source and drain regions uses at least a titanium silicide contact to connect a local interconnect comprising a metal zero layer.

17. The non-transitory computer readable storage medium as recited in claim 16, wherein the program instructions are further executable by a processor to place gate extension metal (GEM) on metal contacts above one or more of the titanium silicide contacts and the two vertical nanowire sheets.

* * * * *

UNITED STATES PATENT AND TRADEMARK OFFICE
CERTIFICATE OF CORRECTION

PATENT NO. : 10,186,510 B2  
APPLICATION NO. : 15/632877  
DATED : January 22, 2019  
INVENTOR(S) : Richard T. Schultz Page 1 of 1

It is certified that error appears in the above-identified patent and that said Letters Patent is hereby corrected as shown below:

In the Claims

In Column 10, Claim 13, Line 24, please delete "connection, and" and substitute -- connection; and --.

Signed and Sealed this
Nineteenth Day of February, 2019

Andrei Iancu
*Director of the United States Patent and Trademark Office*